United States Patent
Rostock

(10) Patent No.: US 10,509,570 B2
(45) Date of Patent: Dec. 17, 2019

(54) METHOD, DEVICE, AND PROGRAM FOR MANAGING A FLASH MEMORY FOR MASS STORAGE

(71) Applicant: Unify GmbH & Co. KG, Munich (DE)

(72) Inventor: Lars Rostock, Zorneding (DE)

(73) Assignee: Unify GmbH & Co. KG, Munich (DE)

(*) Notice: Subject to any disclaimer, the term of this patent is extended or adjusted under 35 U.S.C. 154(b) by 321 days.

(21) Appl. No.: 15/672,373

(22) Filed: Aug. 9, 2017

(65) Prior Publication Data

US 2017/0336992 A1    Nov. 23, 2017

Related U.S. Application Data

(63) Continuation of application No. 14/432,373, filed as application No. PCT/EP2013/003447 on Nov. 15, 2013, now abandoned.

(30) Foreign Application Priority Data

Nov. 21, 2012   (DE) .................. 10 2012 022 728

(51) Int. Cl.
   *G06F 12/00*    (2006.01)
   *G06F 3/06*     (2006.01)
   *G11C 16/10*    (2006.01)

(52) U.S. Cl.
   CPC ........... *G06F 3/0616* (2013.01); *G06F 3/061* (2013.01); *G06F 3/064* (2013.01); *G06F 3/0652* (2013.01); *G06F 3/0679* (2013.01); *G11C 16/10* (2013.01); *G06F 3/0659* (2013.01)

(58) Field of Classification Search
   None
   See application file for complete search history.

(56) References Cited

U.S. PATENT DOCUMENTS

| | | |
|---|---|---|
| 5,559,988 A | 9/1996 | Durante et al. |
| 5,592,669 A | 1/1997 | Robinson et al. |
| 5,802,343 A | 9/1998 | Fandrich et al. |
| 2006/0123166 A1 | 6/2006 | Toebes et al. |
| 2007/0061504 A1 | 3/2007 | Lee |
| 2008/0065813 A1 | 3/2008 | Li et al. |
| 2010/0287427 A1 | 11/2010 | Kim et al. |

FOREIGN PATENT DOCUMENTS

| | | |
|---|---|---|
| DE | 60211653 T2 | 4/2007 |
| GB | 2251323 A | 7/1992 |
| GB | 2251324 A | 7/1992 |

OTHER PUBLICATIONS

Written Opinion of the International Searching Authority for PCT/EP2013/003447 dated Jan. 29, 2014 (Form PCT/ISA/237).

(Continued)

*Primary Examiner* — Jason W Blust
(74) *Attorney, Agent, or Firm* — Buchanan Ingersoll & Rooney PC

(57) ABSTRACT

A method for controlling a flash memory, which is comprised by a secondary unit of a communications device which can be connected to a host and, for mass storage, is written with data be stored. The flash memory can be subdivided into blocks which each comprise storage units, and a storage unit that has been written to can only be written to again if, before writing to the storage unit, all the storage units of the block of the storage unit to be written to are erased.

20 Claims, 12 Drawing Sheets

(56) References Cited

OTHER PUBLICATIONS

International Search Report for PCT/EP2013/003447 dated Jan. 29, 2014 (Form PCT/ISA/210).
Written Opinion of the International Searching Authority for PCT/EP2013/003447 dated Jun. 4, 2015 (Form PCT/ISA/237) English Translation.
International Search Report for PCT/EP2013/003447 dated Jun. 4, 2015 (Form PCT/ISA/210) English Translation.
Peacock (USB in a nutshell—Chapter 4—Endpoint types, http:www.beyondlogic.org/usbnutshell/usb4.shtml,published Jun. 24, 2011.

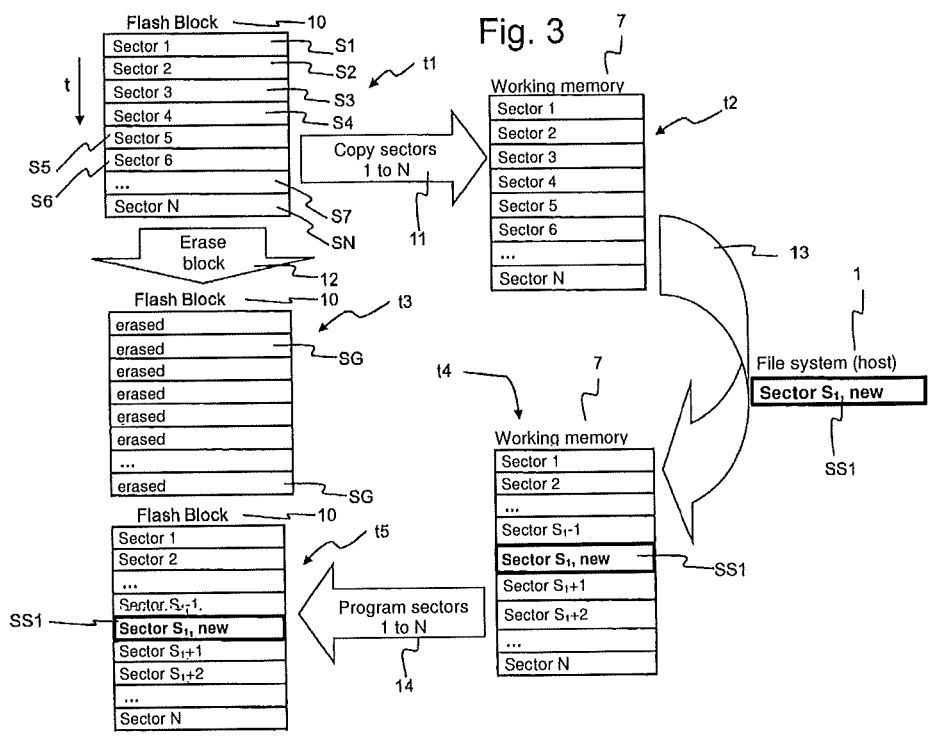

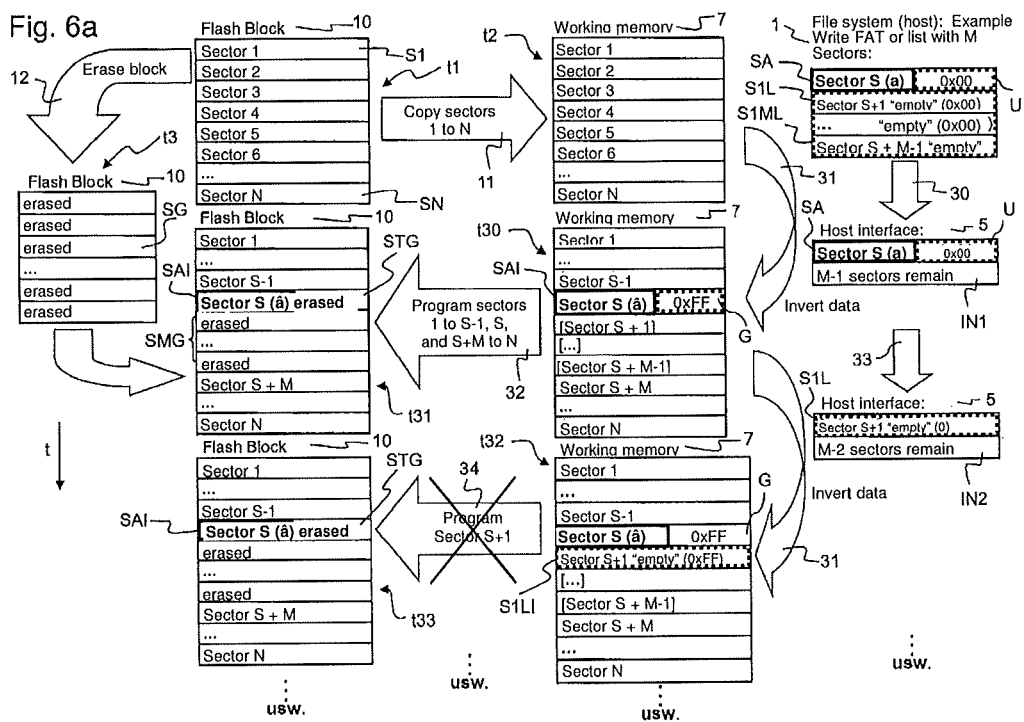

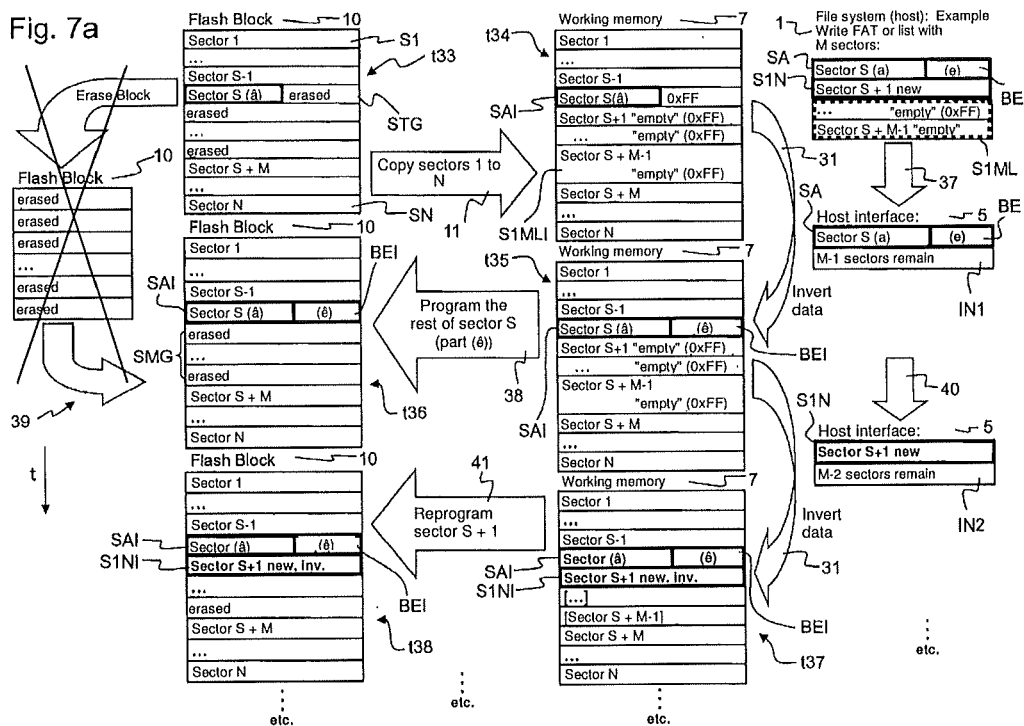

Fig. 8a

| Number of erasure operations | Method as executed in Figure | | | | |
|---|---|---|---|---|---|
| | 4 | 5 | | 6, 7 | |
| 4-kbyte file = 8 sectors (in 1 block) | 8 | 1 | =12.5% | 1 | =12.5% |
| 4-kbyte file = 8 sectors (in 2 blocks) | 8 | 2 | =25% | 2 | =25% |
| 10-kbyte file = 20 sectors (in 2 blocks) | 20 | 2 | =10% | 2 | =10% |
| 16-kbyte file = 32 sectors (in 2 blocks) | 32 | 2 | =6.25% | 2 | =6.25% |
| Write FAT with 30 sectors, 20 of which are "empty" | 30 | 2 | =6.66% | 2 | =6.66% |
| Expand FAT with 30 sectors, 16 of which are "empty" | 30 | 2 | =6.66% | 0 | =0% |

Fig. 8b

| Number of programming operations | Method as executed in Figure | | | | |
|---|---|---|---|---|---|
| | 4 | 5 | | 6, 7 | |
| 4-kbyte file = 8 sectors (in 1 block) | 256 | 32 | =12.5% | 32 | =12.5% |
| 4-kbyte file = 8 sectors (in 2 blocks) | 256 | 64 | =25% | 64 | =25% |
| 10-kbyte file = 20 sectors (in 2 blocks) | 640 | 64 | =10% | 64 | =10% |
| 16-kbyte file = 32 sectors (in 2 blocks) | 1024 | 64 | =6.25% | 64 | =6.25% |
| Write FAT with 30 sectors, 20 of which are "empty" | 960 | 64 | =6.66% | 44 | =4.58% |
| Expand FAT with 30 sectors, 16 of which are "empty" | 960 | 64 | =6.66% | 4 | =0.42% |

METHOD, DEVICE, AND PROGRAM FOR MANAGING A FLASH MEMORY FOR MASS STORAGE

CROSS REFERENCE TO RELATED APPLICATIONS

This application is a continuation application of U.S. patent application Ser. No. 14/432,373, which is the United States national stage under 35 U.S.C. § 371 of PCT International Application No. PCT/EP2013/003447, filed on Nov. 15, 2013, and claiming priority to German Application No. 10 2012 022 728.0, filed on Nov. 21, 2012.

BACKGROUND OF THE INVENTION

Field of the Invention

Embodiments provide methods for managing a flash memory that is comprised by a communication device that can be connected to a host and onto which data to be stored are written for mass storage. The invention further pertains to a computer program product for executing such a method.

Background of the Related Art

Mass storage devices can be a USB memory stick (USB: Universal Serial Bus), memory cards, e.g., for digital cameras, mobile telephones, or multi-media playback devices, or in the form of an SSD (SSD: Solid State Disk). A mass storage device includes a unit with the function of a memory controller and one or more non-volatile memory chips. Memory chips can be so-called flash EEPROM (Electrically Erasable Programmable Read-Only Memory) semiconductor memories, which need no power supply to maintain stored information. There are various flash types, which differ depending on the architecture and memory method chosen. Architecture hereinafter is understood to mean the arrangement of storage cells in the memory chip. The chosen memory method hereinafter is understood to mean the number of voltage levels used for storage within a storage cell. Examples of flash types are NOR Flash, NAND SLC (Single-Level Cell), or NAND MLC (Multi-Level Cell).

In order to write data to the flash memory chips, also known as flash memory, the storage units to be written to must first be erased. Erasing the individual storage units, each of which includes at least one storage cell for storing one bit that can have the logical value "0" or "1", is possible only in areas larger than the written areas, so called blocks, also called erase blocks. A block hereinafter is defined as the smallest volume in bytes on the flash memory that can be erased only as a unit. One block includes $2^z$ bytes (z>13). Typical block sizes for storing data in kbytes are 8, 16, 32, 64, 128, or 256 kb. The unit for writing to or writing on storage cells of the flash memory that is smaller than a block, also called a write unit or page, is defined as the smallest volume in bytes on the flash memory that can only be written as a unit. The size of the blocks, also called erase units, and of the write units depends on the type and size of the flash EEPROM. A NOR flash has block sizes between 8 kb and 256 kb, typically 64 kb, wherein a write unit is 1 byte. Smaller NANO flash memories are available with a block size of 16 kb for a write unit of one page with 512 bytes. Larger NAND flash memories with 128, 512, or 2048 kb block sizes use pages with a (page) size of 2, 4, or 8 kb. The maximum possible number of erase and write operations per unit is limited according to technical factors and depends on the type of flash memory. Erasing sets the individual bits in the memory chip to the value of "1," while writing sets the bits to the value of "0." In order to achieve uniform "wear" and lifespans of the individual memory locations, all bits are programmed to the value of "0" before erasing, so that they can then be set to the value of "1" when erasing occurs. Thus, smaller NAND flash memories are written in write units with 512 bytes while only erased in blocks of 16,384 bytes (16 kb). The smallest data volume used by the host or host system when writing depends on the size of a sector, which is defined as the smallest unit processed all at once in a host's or host system's file system. A working memory and/or flash memory is able to process, at least in principle, a sub-area of this smallest unit of a sector. Sectors include memory sizes of $2^z$ bytes with z>3, typically 512 bytes. If one wishes to equip a USB mass storage device, such as a USB memory stick, with flash memories, one encounters the aforementioned problem of asymmetrical memory sizes for erasing and writing, because common file systems, such as FAT (File Allocation Table), FAT32, etc., use sectors with a 512 byte size, which corresponds to the size of the write unit in a smaller NAND flash memory.

BRIEF SUMMARY OF THE INVENTION

For uniform distribution of the erasing and writing operations across all blocks, expensive memory controllers not only have control capabilities for controlling the necessary erasing and writing operations. Instead, these memory controllers have control capabilities for reading, erasing, and writing data into units suitable for these data, including error correction, for uniform distribution of the erasing and writing operations across all blocks in the memory chip (so-called wear leveling), for managing defective blocks and, if necessary, a method for "refreshing" the stored data. In this case, in order to implement the aforementioned processes, the memory controller needs a table that it uses to manage and link the logical units that are addressed to a host using an interface of the memory controller and the physical units used in the flash memory. In more complex memory controllers, additional information from higher layers according to the OSI 7-layer model (Open Systems interconnection Reference Model)—from the file system used in the host, for example—is used to manage the memory controller. As an example, the host informs the memory controller about the possible erasure of logical data blocks using a special command (TRIM command, see WO 2012/062233).

As long as the volume of data to be stored and the update frequency are less than is the case for main applications of mass storage devices, for example when a flash memory is used as the auxiliary system for a communication device that can be connected to the host for mass storage of data, the mass memory function can be implemented without difficulty. In this case, the separate memory controller of the mass storage device with the aforementioned expensive control method and a table used to link the addressed logical units on the interface to the host with the physical units used in the flash memory can be omitted.

FIG. 1 shows a communication device 2 that is connected to a host 1 and on which a flash memory 9 as a mass storage device is used not as the main data storage system but as an auxiliary system. The communication device has an operator terminal in the form of a keyboard 3, wherein indicated operating statuses of the communication device 2 are displayed to a user on a display 4. Entries of commands via the keyboard and/or other operating elements as well as displays of the operating status of the communication device 2 on the display 4 represent the main function of the communication device 2. The flash memory 9 is used on the communication device 2, for example, to store configuration data and/or voice-dependent text that are to be displayed on the display 4. For example, display text in different languages, e.g., German, English, French, etc., for corresponding output text can be placed in the flash memory 9, wherein a user chooses a certain language, such as German, when configuring the communication device 2. The display texts in the languages other than German are then stored on the flash memory 9 as a mass storage device, although they are not used in that configuration.

FIG. 2 shows a simplified implementation of the function of a mass storage devices. The "NOR Flash" flash memory 9 has no memory controller of its own, but instead is managed through a main processor 6, also called a CPU (Central Processing Unit). The main processor 6 receives commands intended for the flash memory 9 from the host 1 and performs reading, writing, or erasing operations. To establish the functionality of the main processor 6, it is connected to a program memory 8 and a working memory 7, for example RAM (Random Access Memory). The display 4 and keyboard 3 are connected to the main processor 6. The host 1 is connected to the main processor 6 through a host interface 5, which in the case of the communication device 2 shown in FIG. 2 is located in the communication device 2. The storage units and/or memory areas/memory sectors on the flash memory 9 addressed by the host 1 are addressed directly on the flash memory 9 without converting logical into physical units.

Because there is no conversion when addressing logical units on the host 1 into physical units on the flash memory 9 using a separate memory controller, sectors of the file system on the host 1, i.e., sectors on the host 1, that should be written into the flash memory 9 are written to the positions in the flash memory 9 where the host 1 has provided for these sectors to be written.

A simple method for storing the data from the host 1 in the flash memory 9 is shown at various points in time in the direction of the arrow designated "t" in FIG. 3. In a block 10 of the flash memory 9 there are storage units in the form of memory sectors S1 to SN, in each of which one sector 1 to N is saved at a point in time t1. To write to the blocks 10 with a new sector SS1 from the host 1, the sectors 1 to N from block 10, stored in the storage units S1 to SN, are copied 11 into the working memory 7. The sectors 1 to N stored in the block 10 at the point in time t1 are saved into the working memory 7 at a point in time t2. The block 10, in which the new sector SS1 to be stored is located, must be erased before this sector SS1 is written to. When this occurs, the data from the storage units that are not affected by writing in the block 10 that is to be written to must not be changed and must remain stored. For this, the data in the form of sectors 1 to 10 from the complete block 10 are loaded 11 into the working memory 7. Then the working memory 7 is changed 13 at point in time t4 by having the new sector SS1 written to it. After the sectors 1 to N are copied into the working memory 7, the block 10 is erased 12 at point in time t3. After the blocks 10 in step 12 are erased, only erased storage units with erased storage cells SG remain in the block. At point in time t5, the completely erased block 10 is programmed 14 with the data stored in the working memory 7, including the new sector SS1. At point in time t5, the block 10 is thus programmed with the data content from sectors 1 to N, wherein one of the sectors is replaced by the new sector SS1. In order to write one sector into the flash memory 9, a block 10 must be completely erased and N sectors in the flash memory 9 must be programmed, wherein N represents not only the last sector in block 10 but also the number of sectors in the storage units S1 to SN per block 10 to be programmed.

The operations "copy the sectors 1 to N to the working memory 7, 11" and "program the new sector SS1 in the working memory 7, 13" take only a fraction of the time needed for the operations "erase block 10, 12" and "program the sectors 1 to N in the block 10, 14." When listing all that is involved in storing data from host 1 into the flash memory 9, the operations 11 and 13 can thus be omitted.

BRIEF DESCRIPTION OF THE FIGURES

FIG. 3: a typical method for storing a sector in a flash drive, FIGS. 6a and 6b: another embodiment of the invented method for storing specific sectors of a host in a flash memory, FIGS. 7a and 7b: another exemplary embodiment of the invented method for rewriting specific sectors of a host in a flash memory by means of inversion, and FIGS. 8a and 8b: each shows a table for comparing the methods illustrated in FIGS. 4 to 7, referencing the number of erasure operations (FIG. 8a) and referencing the number of programming operations (FIG. 8b).

DETAILED DESCRIPTION OF THE INVENTION

Figure 4A:
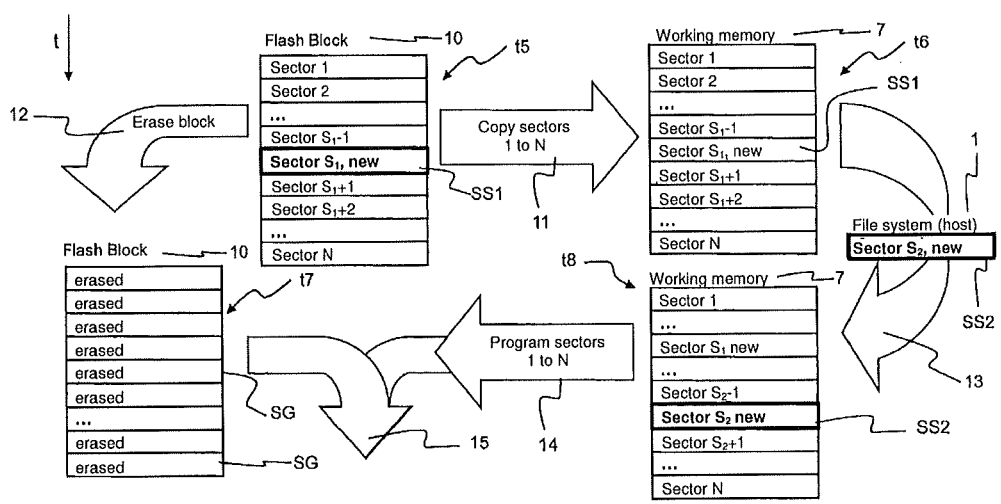
FIGS. 4a and 4b: a typical method for storing multiple sectors in a flash memory.
Figure 4B:
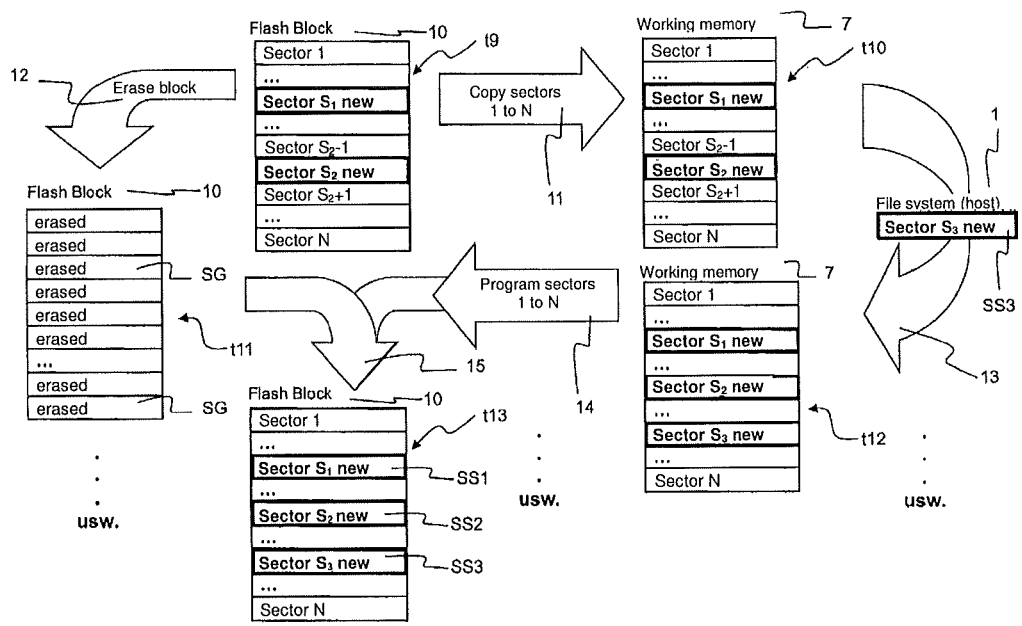

While in FIG. 3 only one sector SS1 is written to the flash memory 9, FIGS. 4a and 4b show the case in which multiple sectors SS2, SS3 are written by the host 1 into block 10 of the flash memory 9. In FIG. 4a, the status of the block 10 is assumed to be as of the point in time t5 according to FIG. 3. When the sector SS2 is written into the block 10, the sectors 1 to N are recopied 11 from the block 10 to the working memory 7, so the memory status in the working memory 7 at the point in time t6 corresponds to the point of time t4 according to FIG. 3. Next, the block 10 is erased again at the point in time t7, so that all of the storage units exist in the block 10 as erased storage units SG. The new sector SS2 is programmed 13 next to the new sector SS1 in the working memory 7, wherein at the point in time t8 in the working memory 7, the new sectors SS1 and SS2 are stored and replace the previously stored sectors of the sectors 1 to N. Next, the sectors 1 to N, including the new sectors SS1 and SS2, are programmed 14, 15 into the erased block 10, so that at the point in time t9 the block 10 contains the new sectors SS1 and SS2 together with the sectors 1 to N, see FIG. 4b. Then, the total content of the block 10 is copied 11 back into the working memory 7, and after that the block 10 is completely erased at the point in time t11. The stored content of the working memory 7 at the point in time t10, including the new sectors SS1 and SS2, is increased when the new sector SS3 is stored at the point in time t12. In addition to the sectors 1 to N, at the point in time t12 three of these sectors are replaced by the new sectors SS1 to SS3. The storage content of the working memory 7 is programmed 14, 15 by programming the updated sectors 1 to N in the erased block 10, wherein in the block 10 the sectors 1 to 10 are programmed, including the new sectors SS1 to SS3 in place of three sectors out of the sectors 1 to N. If the host 1 wants to write multiple sectors 1 to N into the flash memory 9, the steps shown in FIG. 3 must be repeated for each of the sectors SS1, SS2, SS3 to SSN to be written. This repetition of the steps or operations 11, 12, 13, and 14 is necessary because the flash memory 9, like the main processor 6, has no knowledge of the logical use of individual sectors, and therefore all sectors 1 to N in the storage units S1 to SN must be handled in the same way.

If the host 1 wants to write a certain number of sectors M into the flash memory 9, a block 10 in the flash memory 9 has to be erased M times and N sectors have to be programmed into the flash memory 9 M times. If the size of each of the storage units S1 to SN matches the size of each of the sectors 1 to N, for a sector size of 512 bytes and a block size of 16 kb the following numbers result for the operations required for storage:

4-kb file means 8 sectors means erase, 12, a block 8 times, and program, 14, 8×32=256 sectors 10-kb file means 20 sectors means erase, 12, a block 20 times, and program, 14, 20×32=640 sectors 16-kb file means 32 sectors means erase, 12, a block 32 times, and program, 14, 32×32=1024 sectors.

If the host 1, for example, writes the file allocation table (FAT) for the file system of the host 1 into the flash memory 9, and this table includes 30 sectors, for example, a block must be erased 30 times and 30×32=960 sectors programmed. Correspondingly, if the host 1 adds to and rewrites the file allocation table FAT of the file system, with 30 sectors as in the preceding example, a block 10 is erased again 30 times and 30×32=960 sectors are programmed. The method described in FIGS. 3, 4a, and 4b, in which data are loaded from a complete block into the working memory, the storage units to be written to are changed, the complete block is erased and then newly written with the data temporarily stored in the working memory, is provided, for example, with the implementation of a mass storage device that is supplied with the microcontroller (PIC, PIC24, PIC32, etc.) from the Microchip company.

In order to reduce the high amount of effort required to erase blocks and program sectors that is associated with the method illustrated in FIGS. 3, 4, and 4a, intermediate memories (caches) can be used, in which data to be written are first stored until they are later written to the flash memory. If, in the interim period between storage and writing of the flash drive, additional data to be written for the same block arrive in the intermediate memory, these data can be combined with the temporarily stored data, and the affected block only has to be erased and written once.

Another alternative for preventing numerous block erasures and sector programming procedures as shown in FIGS. 4a and 4b, consists in the use of complex file systems such as the TFFS (True Flash File System). With the TFFS, data are distributed in the flash memory such that erasure and rewriting are not necessary until the affected block contains no data, i.e., is not in use. In this case, however, it is necessary to "translate" the original file system, e.g., FAT, FAT32, to the file system used on the flash memory. If such changed data are written to the flash memory, these data are written by the Flash File System into a free, already erased block, and the old data marked as "expired" at the old location. The logical allocation of the data to the actual physical storage location in the flash memory is accomplished using translation tables. A block cannot be erased until all 10 data in the block are marked as "expired." Erasure then occurs, if the memory controller that contains and operates the translation table is not busy with reading, erasing, and writing operations.

While the data to be written to the working memory are temporarily stored in an intermediate memory, direct writing of data to the flash memory is delayed so that additional data can be accumulated before all accumulated data are programmed together into the flash memory. The Flash File System TFFS writes the data immediately to the flash memory but delays erasure. Given the high technical outlay of having an intermediate memory or a separate memory controller, which requires a translation table to link the logical units addressed to the host's interface with the physical units used in the flash memory, an easier solution is to omit the intermediate memory or separate memory controller, with, of course, the additional cost of the additional expense for block erasures and sector programming.

An objective of the invention is to provide a method for managing a flash memory, with which data from a host can be stored easily and efficiently in the flash memory. In particular, the number of erasure and writing operations required for storage should be reduced without the need to use an intermediate memory and/or separate memory controller with a translation table. By providing a method for managing a flash memory, in which the number of erasure and writing operations required for storage is easily reduced, and by providing a computer program product for executing such a method, response times when storing data in the flash memory are reduced and the lifespan of the flash memory is lengthened.

According to the invented method for managing a flash memory that is comprised by a communication device that can be connected to a host and onto which data to be stored are written for mass storage, the flash memory is divided into blocks that contain storage units. A written storage unit can only be rewritten if all storage units in the block of the storage unit to be written to are erased before the storage unit is written to. The flash memory is managed in such a way that at least some of the storage units to be written to, whose data are the same after writing as they were before writing, are neither erased nor written to, and at least some of the erased and to be written storage units, whose data are different after writing compared to before writing, are written to with the data to be stored without re-erasing. Such management of the flash memory is made possible by using the flash memory as an auxiliary system of the communication device, wherein a separate memory controller is not necessary. Execution of the invented method also does not require an intermediate memory and/or memory controller with a translation table. Management of the flash memory therefore does not require any information about the logical content of the host's data to be written other than the bit level, in which the individual data bits can have a content with the value "0" or "1." One byte consists of eight bits. Each bit can have the value of "0" or "1." The eight bits of an erased byte all have the value of "1," so that the byte has the binary value of "11111111." This value corresponds in binary notation to the value "0b11111111" or in hexadecimal notation to the value "0xFF." It is therefore possible for management of the flash memory to be based simply on whether data to be written have bytes with a value unequal to "0xFF." This information can result from analysis of values at the level of individual bits, i.e., at the bit level. Alternatively or additionally, this information can result at the level of individual bytes, i.e., at the byte level. If a byte has the hexadecimal value "0xFF," all of the bits in the byte have the value of "0." To compare the values of the data on the flash memory with those of the data to be written, it is sufficient for the content of the data to be analyzed at the byte level or below it, i.e., at the bit level. Because areas of the flash memory that have been erased and not rewritten after erasure always have the value "0xFF," value information at the byte level is adequate for determining whether all or part of the erased area is to be overwritten with other values for the individual bytes of the data to be written. The flash memory management must therefore be based simply on distinguishing whether the value of each byte of data to be written differs from the value of each byte of the erased and to be written storage units. If the data to be written differ from the values of the individual bytes of the data in the erased storage units, re-erasure of the storage units can be eliminated and the data can be written in the storage units to be written to. However, if the data to be written do not differ from the data in the storage units to be written to, storage in the storage units to be written to can be omitted, because the values of the individual bytes of the storage units to be written to are the same as the values of the individual bytes of the data to be written to the storage units. In this way, by simply comparing the correspondence of the content of the data to be written with the content of the storage units to be written to at the byte level, unnecessary erasure is eliminated and the storage units to be written to are then written to only if writing is necessary based on the content of the data to be written differing from the content of the storage units to be written to. Comparing the content of the data to be written with the content of the storage units to be written to can be done with no intermediate steps immediately before the data are stored in at least some of the storage units to be written to.

Figure 1:
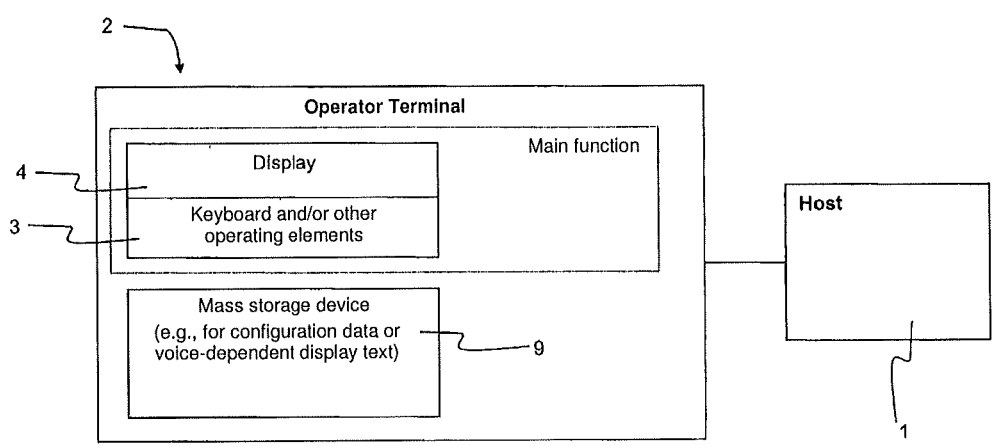
FIG. 1: a typical communication device that includes a flash memory 9.
Figure 2:
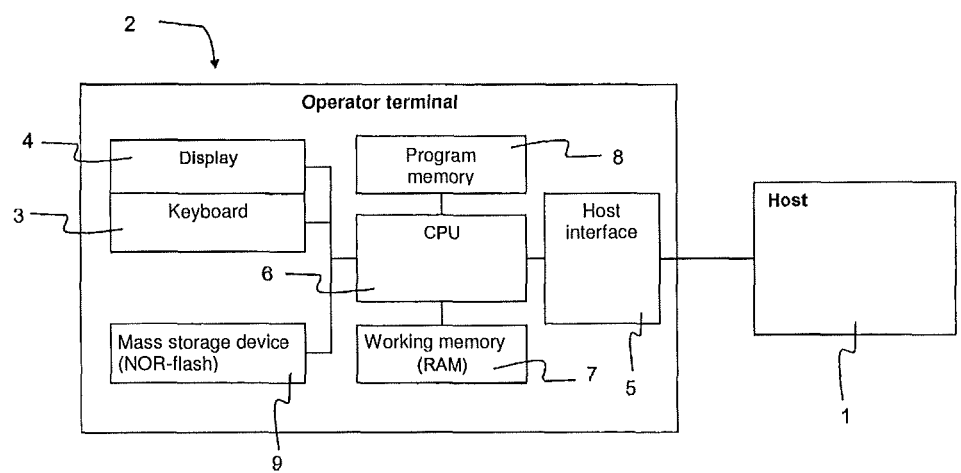
FIG. 2: the typical communication device shown in FIG. 1, wherein the flash memory is managed by a main processor that is connected to a host through an interface.

A flash memory can be a Flash EEPROM semiconductor memory, for example. Flash memory types such as NOR Flash, NAND-SLC, or NAND-MLC can be used as Flash memories. The communication device can be a computer, mobile telephone, tablet PC, PDA (Personal Digital Assistant), smart phone, or other communication device that contains the flash memory. The flash memory can be used as an auxiliary system, thereby eliminating an intermediate memory or memory controller, as in the communication device shown in FIGS. 1 and 2, for example, or can be used as the main system of a communication device, wherein an available intermediate memory and/or memory controller is included as a separate assembly.

The communication device cannot be a terminal, but rather the communication terminal itself can act as a server, in the form of a desktop PC or laptop, for example. Because, for data that are the same after writing as before writing, neither erasure nor writing to the storage units to be written to occurs, and because, for all or part of erased and to be written storage units, re-erasure is eliminated and only data that differ from the data on all or a portion of the erased storage units are written, unnecessary erasure and/or writing operations are eliminated. In this way the number of erasure and writing/programming operations needed to store data in the flash memory is reduced, which is expressed in a lower reaction time for storage and an increased lifespan of the flash memory. Because any delay of the erasure and/or writing operations is limited to comparing the content of the data to be written with the content of the storage units to be written to at the individual byte level, and an intermediate memory and/or a memory controller separate from the main processor of the communication device can be eliminated, the response time for storing data is reduced, maximizing the overall performance of the flash memory.

In one embodiment, the communication device is connected to the host via an interface, and information about the volume of data to be transferred from the host to the flash memory is called up by the communication device from the interface and used to manage the flash memory. Even without an intermediate memory or a memory controller, the host's interface has information about the volume of data to be transferred from the host to the flash memory.

These data are called up from the interface and used to manage the flash memory, wherein storage units that will not have new data written to them in a writing process, after erasure of the block in the flash memory will not be rewritten with the data stored in the storage unit, but rather will be left in erased status until the new data are to be written to the storage units in a later writing process. Using the information contained in the interface regarding the volume of data to be stored, it is then possible, by means of a writing process, to reserve storage units that are erased for the arrival of new data, so that they are not overwritten with data already stored in the storage unit.

Preferably, the information about the data to be transferred from the host to the flash memory is in a mass storage protocol, in particular a USB mass storage protocol. The mass storage protocol has information, for example, about how many of the host's sectors in the flash memory need to be written to. This information is passed on to a writing function of the flash memory. The writing function then prevents just-erased storage units from being written to with data that will be overwritten in a subsequent writing process. These storage units thus remain in erased status, so that only new data are programmed in the flash memory, without having to re-erase the storage units to be programmed before new data are written to them. The information about the data to be transferred from the host to the flash memory is specifically in a USB mass storage protocol. The information is therefore in the host's interface independently of any intermediate memory or memory controller.

In another embodiment, information about the number of consecutive storage units to be written to, in which the data to be transferred are to be written, is provided by the interface.

With the information about the number of storage units to be written to consecutively, adjacent areas of a block on a flash memory to be written with new data can be held or reserved for consecutive writing operations. Because the size of the data content of a sector belonging to the host must be known in the interface for transferring the data, the number of storage units to be written to consecutively can be calculated just from the volume of sectors to be written to in the flash memory.

In an other embodiment, in addition to the content of the first storage unit to be written to, additional information about a number of storage units following the first storage unit is provided by the interface. Thus, if the host wants to write to a certain number of sectors in the flash memory, whose size corresponds to that of a certain number of storage cells in a storage unit, the host gives the command via the interface to the flash memory to write to the first sector in the flash memory with the additional information that when there are M sectors to be written to, M−1 sectors remain after them. The block of the flash memory in which the first sector is to be written to a portion of the storage cells in the storage unit of the block must be erased before the sector is written, because only complete blocks can be erased. The data from the storage units that are not affected by writing as part of a writing process in this block must not be changed during the writing process and must remain stored. To do this, the data from the entire block are temporarily stored, for example in a working memory of the communication device, the data to be written are attached to the temporarily stored data by replacing a portion of the temporarily stored data, the entire block in the flash memory is erased and reprogrammed with the temporarily stored data that include the data to be written. Here only data that must remain unchanged are programmed into the flash memory, i.e., the sectors before the first sector S, as well as the sectors starting with the sector S+M, wherein the first sector S itself, which already contains new data, is also programmed. When the subsequent sectors S+1 to S+M−1 are transferred by the host, these sectors are programmed in the already-erased available areas in the flash memory. In this way, those areas of the flash memory to be written to, whose data are the same after writing as before writing, are neither erased nor written, but rather reserved for those writing processes that are to be used to write these areas with new data. Without information about the content of the data to be written in the flash memory, only with the information about the volume of the data to be written is it possible to save erasure and writing processes without losing stored data.

In one advantageous embodiment, data to be written that are transferred by the host into at least one storage unit of a block in the flash memory are inverted before the at least one storage unit is written. In this way, in file systems that use the hexadecimal value "0x00" for unused storage units, the value "0xFF" can be generated by inversion, which corresponds to the value of erased, unwritten storage units in the flash memory. The inversion causes every bit with the value of "0" to be transformed to the value of "1" and vice versa. In this way, unused areas of the file system that have the value "0x00" become areas with the value "0xFF." Because the value "0xFF" of a byte in the flash memory corresponds to the erased, not written status, the unused areas of the file system must no longer be programmed after the inversion. Only when the content of the file system in this area is changed and contains values other than "0x00" must this area also be programmed in the flash after the inversion. Then, however, no erasure is necessary before programming, because the erased area still contains the erased bytes with the value "0xFF" and can be overwritten without prior erasure. The value "0" corresponds to the hexadecimal value "0x00," wherein, for example, both copies of a file allocation table FAT have the value "0" at the unused locations. Unused parts of the file system are often written to without being changed. For each writing process in the flash memory, writing means an erasure and new programming of the storage units. By inverting the unused areas of the file system, the value of these areas is inverted into the value of erased, unwritten areas of the flash memory. Because of this adaptation of the values of unused areas of the file system to the values of erased storage units, programming of these areas is no longer necessary. This exemplary embodiment therefore includes an additional reduction of erasure and/or writing operations.

In another embodiment, for multiple storage units to be written to, in which the data to be transferred are to be written, the data for all storage units are inverted. This embodiment, of course, has the disadvantage that, for used areas of the file system that do not have the value "0x00," one must invert in order to be able to use these data when reading from the flash memory. However, the exemplary embodiment has the advantage that the flash memory requires no information about the logical content of the data to be stored. The "data inversion" operation, like the operations "copy sectors 1 to N," 11, see FIGS. 3, 4a, and 4b and "program new sectors in the working memory, 13, see FIGS. 3, 4a, and 4b," is omitted, because they require only a fraction of the time needed to erase the block 12 and program the block 14.

Correspondingly, in a further embodiment, unused bytes of the host's data that are to be written to the flash drive have the hexadecimal value 0x00 when placed in the interface, have the hexadecimal value 0xFF of an erased byte in the flash memory after inversion, and, instead of writing the hexadecimal value 0xFF into an erased storage unit, the erased storage unit is kept in its erased status without re-erasing.

In addition to the method for managing a flash memory, this invention also includes a computer program product for executing such a method. The computer program product can consist of software, for example. The computer program product can be stored as binary data on a floppy disk, DVD, CD-ROM, or memory card. The computer program product can also consist of printed source code.

The invention also includes a communication device on which the computer program product is installed. The communication device has the corresponding functions and advantages of the invented method for managing a flash memory and can be a desktop PC, laptop, server, landline telephone, mobile telephone, smart phone, or tablet PC. The host to which the communication device can be connected can be a server or another host. In addition, the host can be a group and/or network of networkable computers in the form of a host system. The host can also be on the Internet or an Ethernet.

Additional exemplary embodiments and also advantages of the invention will be explained below with reference to FIGS. 5 to 8. For better illustration, a scale or true proportional representation is not used in the figures. Unless specifically stated otherwise, the same reference numbers in the figures denote the same components with the same meaning as the references mentioned in FIGS. 1 to 4b that have already been discussed.

Figure 5A:
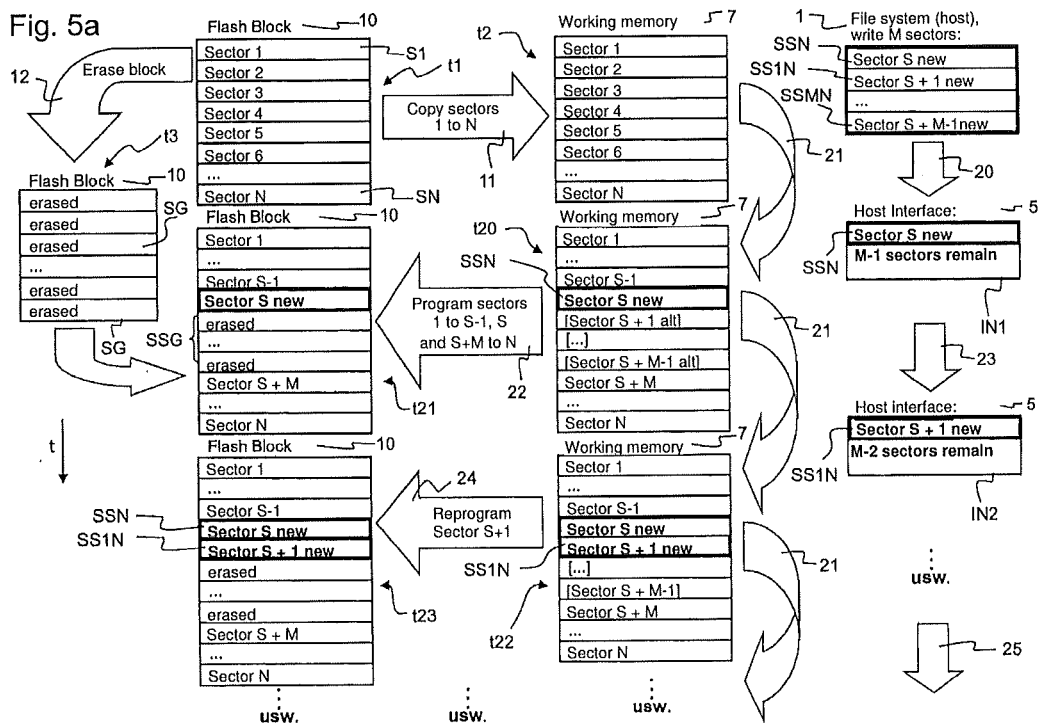
FIGS. 5a and 5b: a first embodiment of the invented method for storing multiple consecutive sectors in a flash memory.
Figure 5B:
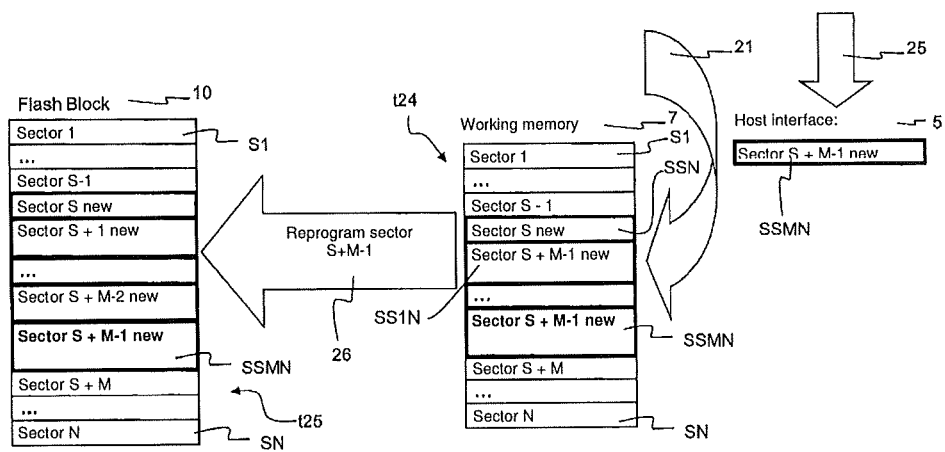

FIGS. 5a and 5b show the invented method in a first embodiment in which multiple consecutive sectors SSN, SS1N, SSMN are to be stored in the block 10 of the flash memory 9. At the point in time t1, sectors 1 to N are stored in the storage units S1 to SN of block 10. After that, the sectors 1 to N are copied 11 into the working memory 7, so that at the point in time t2, the sectors 1 to N are stored in the working memory 7. At the point in time t3, the block 10 is entirely erased, so that each of the storage units S1 to SN is in erased status SG. The steps of the method from the points in time t1 to t3 are the same as those shown in FIG. 3. M sectors are to be programmed by the host 1 into the flash memory 9. These M sectors are divided into the sector S new, SSN, the sector S+1 new, SS1N, additional sectors, and the sector S+M−1 new, SSMN, wherein M is a whole number. Instead of writing only the first sector SSN to be written to the working memory, as shown in FIG. 3 at point in time t4, through the interface 5 the first sector SSN to be written and a piece of information IN1 are sent to the communication device 2, indicating that M−1 sectors to be written to the flash memory 9 are still to come. At the point in time t20, only the first sector SSN is stored 21 in the working memory 7, wherein the entire content of the working memory 7 is not programmed into the erased block 10 at the point in time t20. Instead, the sectors 1 to S−1, S as a new sector SSN, and the sectors S+M to N are programmed 22. At the point in time t21, the storage units located between the sector SSN and the sector S+M are erased. This erased area of the block 10, SSG, is available for subsequent writing operations and/or writing processes used to write new data from the host into the block 10. The communication device 2 or the controller of the flash memory 9 thereby use the piece of information IN1, that M−1 sectors remain to be written into the flash memory 9, for writing to the block 10 in such a way that the sectors SS1N to SSMN not yet written to the block 10 of the flash memory 9 are reserved as the erased area SSG in the block 10. At the point in time t22, the working memory 7 is written to with the next sector S+1 new, SS1N, to be written, wherein through the interface 5, together with the next sector SS1N to be written, the piece of information IN2 has been sent to the communication device 2 indicating that M−2 sectors remain to be written to the block 10. The piece of information IN2 is sent to the controller of the flash memory 9, which is managed by the main processor 6 in the communication device 2 shown in FIG. 2. Therefore, only the new sector S+1 new, SS1N, is programmed 24 into the block 10, whereby the block 10 has stored the second new sector SS1N together with the first new sector SSN at the point in time t23. According to the chronological sequence that is represented in FIGS. 3, 4a, 4b, 5a, 5b, 6a, 6b, 7a and 7b as a downward-pointing arrow labeled t for time, the method for storing individual new sectors continues from the interface 5 to the working memory 7 and from there to the block 10, as shown by the indication "etc." and the arrow 25 in FIG. 5a. As soon as the last sector SSMN to be stored is able to be written to the block, this sector is stored 21 into the working memory 7, and the last new sector S+M−1 new, SSMN, to be stored in the flash memory 9 is stored in the last remaining storage unit, which is in erased status SG, in the area of erased units SSG. With the last of the M sectors that are to be stored consecutively, no additional information is sent from the interface to the controller of the flash memory 9, because no such information is necessary. On the basis of the first notification IN1, that M−1 sectors are to be written to the block 10 of the flash memory 9, the reserved erased area SSG is allocated in such a way that this erased area is adequate for all of the M sectors to be written to the block 10. In this regard, in another embodiment, it is necessary to send only the piece of information IN1, that M−1 sectors remain to be written to the memory, while the piece of information IN2, indicating that M−2 sectors are to be written to the flash memory 9, can be omitted.

If the host 1 wants to write a certain number of consecutive sectors M into the flash memory 9, and these sectors to be written are all to be written to storage units of a block 10, then the block 10 in the flash memory 9 has to be erased once and N storage units have to be programmed into the flash memory 9. If the consecutive sectors are distributed to multiple blocks, as is the case when the sum of the numbers S and M is greater than the number N of storage units in the block, then all blocks B that are to be used for storage must be erased once, and B×N sectors are to be programmed into the flash memory 9. In this regard it is assumed that the data volume of one storage unit corresponds to the data volume of one sector.

At a sector size of 512 bytes and a block size of 16 kb, the following operations are necessary for writing to the flash memory 9:
- 4-kb file means 8 sectors (in one block) means erase a block once and program 32 sectors,
- 4-kb file means 8 sectors (in two blocks) means erase a block twice and program 2×32=64 sectors,
- 10-kb file means 20 sectors (in two blocks) means erase a block twice and program 2×32=64 sectors,
- 16-kb file means 32 sectors (two blocks) means erase a block twice and program 2×32=64 sectors.

Figure 6B:
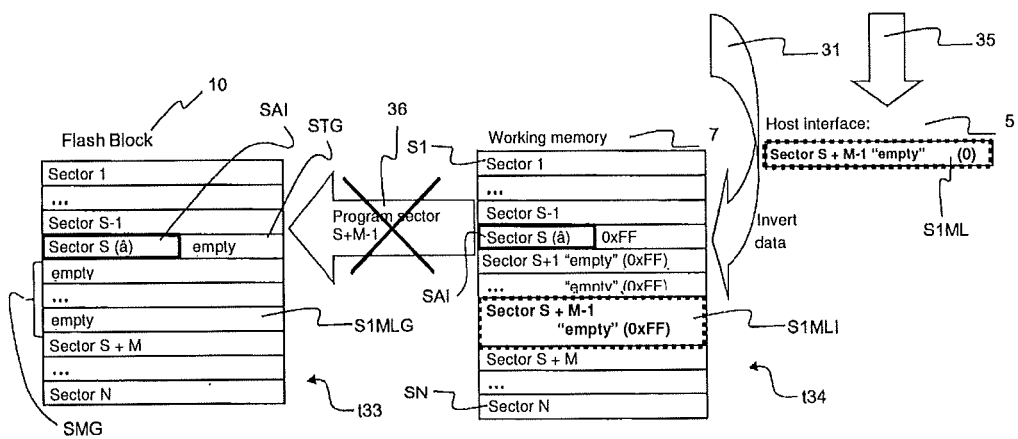

If, for example, the host 1 writes the file allocation table FAT of the file system and it consists of 30 sectors, then as a maximum, if the 30 sectors are distributed to 2 blocks, a block must be erased twice and 2×32=64 sectors must be programmed. If the host expands the FAT of the file system and rewrites it with 30 sectors, as in the preceding example, then again a block must be erased twice and 2×32=64 sectors are to be programmed in the flash memory 9. FIGS. 6a and 6b show the invented method in a further embodiment, in which specific sectors of the host 1 will be written into the flash memory 9. As illustrated in FIGS. 3 and 5a, the block 10, which at point in time t1 includes the sectors 1 to N in the storage units S1 to SN, is entirely copied 11 into the working memory 7, and then the block 10 is entirely erased at point in time t3, so that all storage units S1 to SN in the block 10 are then in erased status SG. The host 1 wants to write a FAT or a list with M sectors into the flash memory 9. The host issues a command through the interface 5 to the controller of the flash memory 9 to write the first of the M sectors, which includes a first sub-area SA and a second sub-area U, to the block 10 with the additional information IN1, indicating that M−1 sectors remain to be stored. The piece of information IN1 added to the sub-areas SA and U of the first sector to be written is generated by the interface 5 using information from the host 1 on how many sectors are to be written. In contrast to the first embodiment of the invented method according to FIGS. 5a and 5b, the data contained in the sub-areas SA and U to be stored, of the first sector to be stored, are inverted 31. Here the first sub-area SA of the first sector to be written is inverted into the first sub-area SAI, wherein the unused second sub-area of the first sector U to be stored, which contains the hexadecimal value 0x00, inverts into the second sub-area G of the first sector to be written, which after the inversion has the hexadecimal value 0xFF. The first sector to be written, inverted in this manner, is then programmed into the working memory 7 as the inverted first sub-area SAI and as the second inverted sub-area G at the point in time t30. Next, corresponding to the programming step 22 in FIG. 5a, the sectors 1 to S−1, the inverted sector S to be written with the sub-areas SAI and G and the sectors S+M to N are programmed 32 into the block 10. In this case, only the data that must remain unchanged are programmed into the flash memory 9, which involves all sectors that precede the sector S, as well as the sectors that follow the sector S+M, as well as the first sector to be written itself, which contains the new inverted data. At the point in time t31, in the block 10, which contains the unchanged sectors 1 to S−1 and S+M to N, there is an erased area SMG available for the host's additional sectors to be stored.

With respect to the first sector to be stored, only data that differ from the value 0xFF for erased data in the storage units of the block 10 are stored in the block 10. Then only the first sub-area of the first sector to be stored, SAI, is stored in the block 10, and the second inverted sub-area G of the first sector to be stored is not programmed into the block 10, because its value matches the content of the erased storage units 0xFF. The second sector S1L that follows the first sector to be written is a so-called "empty" sector, because the data in this sector contain unused bytes with the value of 0, which corresponds to the hexadecimal value of 0x00. As for the storage of the first sector to be written into the working memory 7, the sector S1L is inverted 31 and stored in the working memory 7 as the inverted sector S1L1. Additionally, the interface sends the piece of information IN2, indicating that M−2 sectors remain to be stored in the flash memory 9, to the controller of the flash memory 9.

Because the second sector S1L1 to be written after inversion has only the hexadecimal value 0xFF, which matches the content of the storage units in the erased status SG of the erased area SMG, this sector is not programmed 34 into the block 10. Instead, the block is in the same status at the point in time t33 as at the point in time t31. Because the content of erased storage units matches the content of the second sector S1L1 to be written, no data content is lost by not programming the inverted second sector S1L1 to be written.

If subsequent sectors are transferred from the host 1 to the interface 5, they are programmed into the already erased area SMG in the flash memory 9 only if they contain data that differ from unused data with the value of 0, which corresponds to the hexadecimal value of 0x00. As long as these sectors are "empty," i.e., contain only bytes with 0x00, due to inversion these areas become areas in which all bytes contain the value of 0xFF, which correspond to the content of erased storage units in the erased area SMG of the flash memory. These "empty" sectors are therefore not programmed into the flash memory. According to the illustration in FIG. 6b, the last sector S1ML to be stored is also a sector that contains only unused bytes with the value of 0. After inversion, this sector is the inverted sector S1ML1 with the value 0xFF in the working memory 7 at the point in time t34. Because the inverted last sector S1ML1 to be written has the same data content as the erased area SMG in the block 10, there is no programming step for writing the sector S1ML1 to the block 10, 36. Instead, the erased storage range S1MLG of the erased area SMG matches the data content of the last inverted sector S1ML1 to be written. By inverting data from sectors to be written, which contain unused data, a programming step is omitted according to the invention, because the data in erased storage units and the inverted data from sectors with unused data match each other. Of course, in order to use the inverted stored data, a reverse inversion is necessary, which is another inversion, but the time and calculation effort for the inversion is negligible compared to the time and calculation effort for programming and can be disregarded.

Figure 7B:
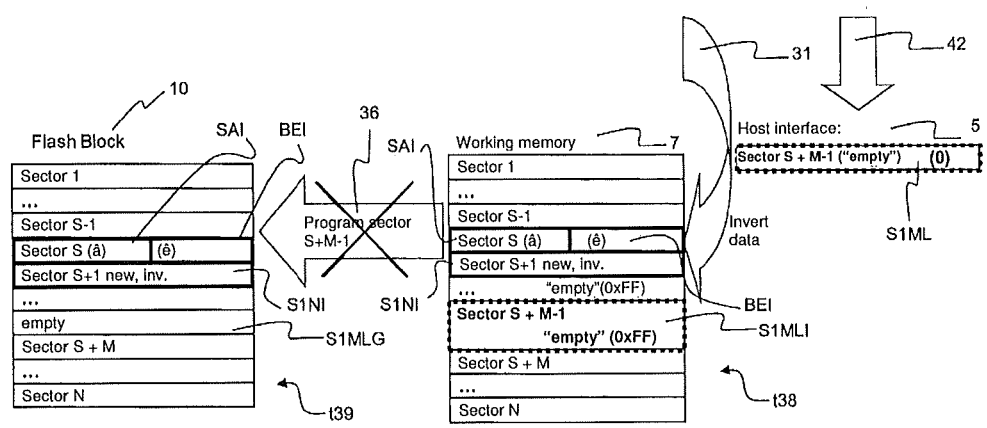

FIGS. 7a and b illustrate another embodiment of the invented method, in which specific sectors of the host 1 are repeatedly written into the flash memory 9. In FIG. 7a, the initial status of the block 10 is assumed to be the status at the point in time t33 as shown in FIGS. 6a and 6b. After all sectors 1 to N are copied into the working memory 7 at the point in time t34, which corresponds to the point in time t34 in FIG. 6b, M sectors are to be written into the flash memory 9 again. The first sector to be written includes a first sub-area SA and a second sub-area BE, as well as a second sector S1N to be written. The additional sectors to be written are so-called "empty" sectors, which contain only unused data. The last "empty" sector to be written is the sector S+M−1, S1ML. After sending the sectors to be written to the interface 5, 37, the interface sends the first sector to be written with the sub-areas SA and BE as well as the piece of information INL indicating that M−1 sectors remain to be written, to the controller of the flash memory. Then the first sector to be stored, with the sub-areas SA and BE, is inverted and stored in the working memory 7 at the point in time t35 as inverted sub-areas SAI and BEI. Next, because the first sub-area SAI is already programmed in the block 10, only the second sub-area BEI is programmed into the block 10 as the rest of the first sector S to be written, wherein no erasure of the storage units of the block 10 is necessary, 39. Thus, at the point in time t36, the previously erased area STG in the block 10 is replaced by the inverted second sub-area of the first sector to be written BEI. Next, the second sector S1N to be written is read 40 from the file system of the host 1 and sent to the controller of the flash memory by the interface 5, together with the piece of information IN2, indicating that M−2 sectors remain to be stored. After inversion of the data from the sector S1N, 31, this sector is stored as the inverted sector S1NI in the working memory 7 at the point in time t37. Next, the second sector to be stored is programmed in inverted form S1NI into the previously erased area SMB of the block 10. Thus, at the point in time t38, the inverted sub-areas of the first sector to be written, SAI, BEI, and the inverted second sector to be written S1N1 are programmed into the block 10. The method for reading individual sectors to be programmed with the information on how many sectors remain to be stored, the inversion, storage in the working memory, and programming the inverted sectors that are occupied by not unused data, i.e., payload data, into the flash block 10 continues until the last sector to be written is ready to be programmed. In FIG. 7b, this last sector S1ML is a so-called "empty" sector, which, after inversion, 31, is programmed into the working memory at the point in time t38 as an inverted sector S1ML1. Because the inverted sector S1ML1 has only data with the value 0xFF, which match the content of the erased storage unit S1MLG in the block 10, the inverted sector S1ML1 is not programmed into the block 10, 36. Thus, at the point in time t39 as compared to the point in time t33, the block 10 includes additionally only the inverted second sub-area BEI of the first sector to be written and the inverted second sector S1NI to be written. The exemplary embodiment shown in FIGS. 7a and b illustrates the case in which the host wants to update a FAT or list in such a way that portions with existing data remain unchanged and additional data are added into previously erased areas. The areas of the block 10 that remain unchanged are occupied by the sectors 1 to S−1 and S+M to N. The erased area that is to be occupied by additional data is the area SMG. Because the data already located in the flash memory 9 are partially unchanged, but instead only previously erased areas are written with new data, the block 10 of the flash memory 9 does not need to be entirely erased before being written to. The data from the entire block 10 are loaded into the working memory 7, the data transferred by the host for the sectors to be written are placed into the working memory 7 after inversion and are not programmed into the flash memory 9 unless they differ from the erased areas of the flash memory. In the exemplary embodiment from FIGS. 7a and 7b, this applies to the second part of the first sector to be written, BE, and to the sector S1N as the second sector to be written. The subsequent sectors transferred by the host 1 are then programmed into the corresponding already erased area SMG in the flash memory 9 only if they contain data that differ from unused data. As long as these sectors are "empty," i.e., contain only bytes with the value 0x00, due to inversion these areas become areas in which all bytes contain the value of 0xFF, i.e., values that match the content of erased areas of the flash memory SMG. These "empty" sectors are therefore not programmed into the flash memory. In the method described in FIGS. 6 and 7, there is no distinction between FAT, list, or data range, but rather inversion takes place in the same fashion for all sectors to be written. Of course, this system has the disadvantage that sectors containing used values that differ from the unused values are "unnecessarily" inverted, but the advantage that the controller of the flash memory requires no information about the logical content of the sectors to be written. If a memory controller has a piece of information about the logical content of the various sectors, equal inversion of all sectors to be written can be omitted and only the sectors whose data have unused values of 0, which match the hexadecimal value of 0x00, are inverted.

The following examples are based on the exemplary embodiments from FIGS. 6 and 7:

At a sector size of 512 bytes and a block size of 16 kb, the following operations are necessary for writing, assuming 32 storage units per block, each of which can store one sector:
- 4-kb file means 8 sectors (in one block) means erase a block 1 time and program 32 sectors,
- 4-kb file means 8 sectors (in two blocks) means erase a block 2 times and program 2×32=64 sectors,
- 10-kb file means 20 sectors (two blocks) means erase a block 2 times and program 2×32=64 sectors,
- 16-kb file means 32 sectors (two blocks) means erase a block 2 times and program 2×32=64 sectors.

If, for example, the host 1 writes the file allocation table FAT of the file system and it consists of 30 sectors, for example, with 20 of those sectors containing no data (i.e., "empty"), then as a maximum, if the 30 sectors are distributed to 2 blocks, a block must be erased twice and 2×32-20=44 sectors must be programmed. If the host 1 expands the FAT of the file system of the host 1 and rewrites with 30 sectors, wherein only 16 sectors contain unused data, i.e., are "empty," then no blocks need to be erased and 20−16=4 sectors need to be programmed.

FIG. 8a shows an overview in table form of the number of erasure operations 50 for the method as executed in FIGS. 4 to 7, 51. It is assumed that one block has 32 storage units capable of storing one sector each. It is therefore assumed that 32 sectors can be stored in one block. For a 4-kb file, which means 8 sectors and is stored in 2 blocks, 52, the usual method as executed in FIG. 4 involves 4 to 8 erasure operations, 12, in each of which one block is to be erased entirely. The reason for this is that, even when programming only one individual sector in the block, the entire block first has to be erased. In contrast to what is shown in FIG. 4, when executing the invented method as in FIGS. 5 to 7, the block in which data are to be written is erased only once. Because the 8 sectors are to be written to 2 blocks, only 2 erasures, 54, 56, of entire blocks are required, as compared to 8 erasures, 53. This means that the number of erasure operations for writing 8 sectors into 2 blocks, 52, with the invented method is only 25% of the entire block erasure operations required with the usual method. In the example of writing a file allocation table FAT with 30 sectors to 2 blocks, wherein 20 sectors out of the 30 sectors to be written are occupied by unused data, i.e., are "empty," 58, with the usual method as in FIG. 4, erasure of entire blocks is required 30 times. On the other hand, in the embodiment of the invention shown in FIGS. 5 to 7, erasure of an entire block is required only twice, because the 30 sectors are written into 2 different blocks. Beginning with the status of the flash memory as in the example of writing 30 sectors to 2 blocks, wherein 20 sectors contain unused data, 58, if the FAT is to be expanded with 30 sectors, 16 of which contain unused data, i.e., are "empty," 59, again with the usual method as in FIG. 4, entire blocks must be erased 30 times. On the other hand, according to the invented method illustrated in FIG. 5, without inversion of the data to be written, erasure of entire blocks, 61, is necessary 2 times, which is 6.66% of the number of erasures with the usual method as in FIG. 4, 62. With the invented method as in FIGS. 6 and 7, in which the data to be written are inverted before programming into the flash memory, because there are only 4 sectors to be stored in the flash memory that contain payload data, with inversion of the data to be written, no erasure of existing blocks, 0, is necessary.

FIG. 8b shows an overview in table form of the number of operations to program data into the working memory 7 in the block 10 of the flash memory 9, 65, using the method as executed in FIGS. 4 to 7, 51. The programming operation here corresponds to step 14 in FIGS. 4a and 4b and to steps 22, 24, 26 in FIGS. 5a and 5b. The programming operations further correspond to step 32 in FIG. 6a and to steps 38, 41 in FIG. 7a. In the relevant example discussed in FIG. 8a of a 4-kb file, meaning 8 sectors, to be written to 2 blocks, 52, assuming that 32 sectors can be written to one block as shown in FIG. 8a, the result is 256 programming operations, 66, for the usual method as in FIG. 4. Because the usual method requires that all 32 storage units must be erased for every sector, 8×32=256 programming operations are necessary. In contrast, with the invented method as in FIGS. 5 to 7, only 64 programming operations, 67, 69, are needed, since each of the 2 blocks to be written to must be programmed in its entirety once, i.e. 32 times. The result for the number of programming operations, as for the number of erasure operations, is a fourfold difference (25%) between the invented method as in FIGS. 5 to 7 and the usual method as in FIG. 4, 70. In the case of writing a file allocation table FAT with 30 sectors to 2 blocks, wherein 20 sectors out of the 30 sectors contain unused data, 71, the result with the usual method as in FIG. 4 is 960 programming operations (each of the 32 sectors has to be programmed 30 times). In contrast to the usual method, with the invented method as in FIG. 5 and without inverting the data to be written, only 64 programming operations are required (each of the 2 blocks to be written to must be programmed in its entirety, i.e. for each of its 32 sectors). With the invented method as in FIGS. 6 and 7, in which the data to be written are inverted before being stored in the block 10, because data that contain the same values as erased storage units are not programmed, in this case only 40 programming operations (64−20=44) are required instead of the 64 programming operations as in the method in FIG. 5. Beginning now with the status of the flash memory having a written file allocation table with 30 sectors in 2 blocks, wherein 20 sectors out of the 30 sectors contain unused data, if this file allocation table is to be expanded with 30 sectors, 16 of which contain unused data, 72, again with the usual method as in FIG. 4, 960 programming operations, 73, are needed. Using the invented method as in FIG. 5 and without inverting the data, 64 programming operations are necessary (74). 64 programming operations compared to 960 programming operations as in the method in FIG. 4 corresponds to a ratio of 6.66%, 75. An even greater reduction in programming operations results from comparing the usual method shown in FIG. 4 with the invented method from FIGS. 6 and 7. Because 16 sectors out of the 30 sectors to be written contain unused data and 20 sectors in the block 10 exist as erased storage units, 16 of which remain as erased storage units after the expansion of the file allocation table, only 4 of the erased storage units with data that differ from unused data must be programmed, 76. This corresponds to a ratio of 0.42% of required programming operations compared to the usual method.

The features of the invention described with reference to the embodiments shown, such as inversion of the data to be written, 31, in FIGS. 6a, 6b, 7a, and 7b or programming of only one part of a sector in a storage unit, 38 in FIG. 7a, can also exist in other embodiments of the invention, as shown in FIG. 5a and/or FIG. 5b, for example, except when stated otherwise or when impossible for technical reasons.

In summary, by means of the invented method and the computer program product for executing the invented method, even without a memory controller to manage the flash memory, information is available about the volume of data to be written to the flash memory. With the information on the volume of data to be written, the storage units required to write the data can be reserved as erased units until the data are written, so that entire-block erasure operations can be eliminated. In addition, with the invented method, existing file systems FAT/FAT32 can have unused areas of the sectors to be written with the same value, which after inversion of the values of the unused areas corresponds to the value of erased unwritten storage cells in a block. Therefore, when writing sectors that contain unused data, there is no need to program these unused data to the flash memory after they are inverted. In this way, the number of required erasure and programming operations is reduced, which increases the speed of writing data to the flash memory as well as the lifespan of the flash memory.

The invention claimed is:

1. A method for controlling a flash memory of a communication device of a user, the communication device being connectable to a host, the flash memory being written with data to be stored for mass storage, the method comprising:
dividing the flash memory into blocks, each of the blocks comprising memory units such that a written memory unit is re-writable when all memory units of the block containing the memory unit to be written to are deleted prior to writing to the memory unit;
connecting the communication device to the host via an interface such that information about a quantity of data that is to be transmitted by the host to the flash memory is evaluatable for controlling the flash memory;
controlling the flash memory such that:
the memory units to be written to for writing of the data from the host to the flash memory that will result in the written data remaining unchanged after writing of the data compared to a state prior to the writing of the data is neither deleted nor written to,
the memory units to be written to for the writing of the data from the host to the flash memory will result in the written data being changed after the writing as compared to prior to the writing, is written with the data to be stored without another deletion, and
the information on the number of successive memory units to be written to is used to hold available as deleted units the memory units required for writing the data until the data has been written to prevent delete operations of entire blocks.

2. The method of claim 1, wherein the information on the number of successive memory units to be written to is used to hold available as deleted units the memory units required for writing the data until the data has been written to prevent delete operations of entire blocks is performed without a memory controller for controlling the flash memory.

3. The method of claim 1, wherein the method is performed without a memory controller of the communication device performing any step of the method.

4. The method of claim 1, wherein a comparison of values between pre-existing flash memory data and the data to be written is performed at a level that differs from a byte level and also differs from a bit level.

5. The method of claim 1, wherein the controlling of the flash memory is performed such that only information on whether data to be written has bytes each of which having a value unequal to "0xFF", wherein this information is provided by analyzing values of the data on the bit level and/or on the byte level.

6. The method of claim 1, wherein the information on the data that is to be transmitted by the host to the flash memory is provided in a mass storage protocol or a universal serial bus (USB) mass storage protocol.

7. The method of claim 1, wherein the information is provided independently from a buffer or a memory controller in the interface.

8. The method of claim 1, wherein the number of successive memory units to be written to is deducted only from a number of memory units as a quantity of sectors that are to be written to the flash memory via the interface.

9. The method of claim 8, comprising:
knowing, via the interface, a size of data content of a sector of the host relating to the data to be written for transmitting the data to be written to the flash memory.

10. The method of claim 1, wherein the information is provided by the interface in addition to a content of a first memory unit to be written to as additional information on a number of memory units succeeding the first memory unit.

11. The method of claim 1, comprising:
inverting the data to be transmitted by the host that is to be written to the flash memory prior to the writing of the data to any of the memory units.

12. The method of claim 11, wherein the data for all memory units is inverted prior to transmitting the data from the host for writing to the flash memory.

13. The method of claim 11, wherein unused bytes of data of the host that are to be written to the flash memory have a hexadecimal value 0x00 when stored in the interface, a hexadecimal value 0xFF of a deleted byte in the flash memory (9) after inverting, and the deleted memory unit is kept in the deleted state without another deletion instead of writing the hexadecimal value 0xFF to a deleted memory unit.

14. The method of claim 1, wherein areas of a file system of the flash memory to be written to not having the value "0x00" are inverted to be able to use data of these areas when reading the flash memory such that no information on logical content of the data to be saved is needed by the flash memory.

15. The method of claim 1, wherein
the flash memory is used as an ancillary unit of the communication device and a buffer and/or memory controller with a translation table are not required for the controlling of the flash memory.

16. A non-transitory computer readable medium having a computer program for performing the method of claim 1 stored thereon such that a processor of a device causes the device to perform the method when the program is run by the processor.

17. A communication device, the communication device having the non-transitory computer readable medium of claim 16.

18. The communication device of claim 17, wherein the communication device is a terminal.

19. The communication device of claim 17, wherein the communication device is a mobile telephone, a tablet personal computer, a personal digital assistant, a smart phone, a laptop computer, or a desktop personal computer.

20. A method for managing a flash memory of a communication device that is connectable to a host device, the method comprising:
communicatively connecting the host device to the communication device having the flash memory via an interface;
the communication device calling up information about a volume of data to be transferred from the host device to the communication device via the interface;

the communication device storing first storage units of a first block into working memory of the communication device in response to the information about the volume of data to be transferred from the host device;

inverting data transferred by the host device that is to be written into the first storage units of the first block in the flash memory before the data is written into the first storage units so that inversion causes each and every bit of the first block with a value of 0 to be transformed to a value of 1 and each and every bit of the first block with a value of 1 to be transformed to a value of 0 to mimic a value that corresponds to an erased not written status of a storage unit of the flash memory; and comparing the inverted data to data of the first storage units already stored in the flash memory such that the first storage units of the flash memory having a value of 0 are not erased prior to the data transferred by the host device being written into those first storage units of the first block of the flash memory.

* * * * *